United States Patent [19]

Webster et al.

[11] Patent Number: 4,831,497
[45] Date of Patent: May 16, 1989

[54] REDUCTION OF CROSS TALK IN INTERCONNECTING CONDUCTORS

[75] Inventors: Harold F. Webster, Scotia; John P. Quine, Schenectady, both of N.Y.

[73] Assignee: General Electric Company, Schenectady, N.Y.

[21] Appl. No.: 906,105

[22] Filed: Sep. 11, 1986

[51] Int. Cl.⁴ ............................................. H05K 01/18
[52] U.S. Cl. ........................................ 361/406; 29/829; 29/846; 174/32; 174/36; 333/1; 333/5; 333/238; 361/407; 361/409; 357/55
[58] Field of Search ............... 361/404, 406, 407, 409; 29/829, 846; 333/1, 5, 134, 136, 238; 174/32, 36; 357/55

[56] References Cited

U.S. PATENT DOCUMENTS

| | | | |
|---|---|---|---|
| 2,550,409 | 4/1951 | Fernsler | 333/5 X |
| 2,984,802 | 5/1961 | Dyer et al. | 333/134 |
| 3,543,198 | 11/1970 | Stopper | 174/36 X |
| 3,876,822 | 4/1975 | Davy et al. | 361/409 X |
| 4,157,612 | 6/1979 | Rainal | 174/32 X |
| 4,495,479 | 1/1985 | Hermann | 333/238 |
| 4,498,122 | 2/1985 | Rainal | 174/36 X |
| 4,571,451 | 2/1986 | Linsker | 361/409 X |

FOREIGN PATENT DOCUMENTS

| | | | |
|---|---|---|---|
| 1224799 | 9/1966 | Fed. Rep. of Germany | 174/32 |
| DT 2705629 | 8/1978 | Fed. Rep. of Germany | 333/5 |

Primary Examiner—R. R. Kucia
Attorney, Agent, or Firm—Marvin Snyder; James C. Davis, Jr.

[57] ABSTRACT

A circuit assembly including a plurality of integrated circuit chips wherein electrical interconnections between chips at a relatively large distance from each other are accomplished by a conductor bus comprising a first section including conductors running adjacent and parallel to each other for a distance substantially equal to an integral number of half wavelengths of the base frequency of signals of the circuit and second sections including conductors which sharply diverge toward associated integrated circuit chips for electrical connection therewith.

8 Claims, 1 Drawing Sheet

REDUCTION OF CROSS TALK IN INTERCONNECTING CONDUCTORS

BACKGROUND OF THE INVENTION

1. Field of the Invention

This application relates to assembled electronics circuit packages and, in particular, to schemes for interconnecting circuit elements or integrated circuit chips to each other on a circuit board. Specifically, the invention has application to circuit assemblies which include conductive runs extending close enough to and parallel to each other for a distance which results in more than negligible cross talk, the conductive runs operating to interconnect various electronic elements of the circuit which operate at very high switching speeds.

2. Description of the Prior Art

The current trend toward ever greater functionality on a single circuit board requires the interconnection of many integrated circuit chips on a single circuit board. With this trend of more circuit elements on a single circuit board, there exists the pressing need for providing complex interconnection schemes for interconnecting such devices to operate according to design. As integrated circuit technology advances towards ever increasing large scale integration and high performance, there is a concurrent increase in the frequencies of the switching signals carried by the various elements and interconnecting runs and it is necessary to provide interconnection and routing methods that are compatible with such increased signal frequencies in order to meet overall performance demands. Thus, the problems of signal delay, package impedance and cross talk become extremely critical. The principles of transmission line technology must, therefore, be engineered into these packages in order to hurdle the extremely high device switching speeds and the frequencies of signals on lines or conductors interconnecting electronic devices in each circuit package.

This application is directed specifically to apparatus and methods for reducing cross talk between adjacent interconnecting runs of such a circuit assembly. In the past, with circuit clock rates and switching rates at more modest levels (below 50 MHz.) the problem of cross talk in interconnecting conductive runs was minimal. Even with higher speeds, the problems remain of little concern in intrachip interconnections since conductive runs on a single integrated circuit chip, typically only about a quarter inch on a side, remain well below the length at which cross talk becomes a concern. Cross talk, as used herein, refers to the coupling of energy from one conductive run to a closely adjacent parallel conductive run as a result of magnetic and electric field effects, i.e., inductive and capacitive coupling existing between adjacent conductive tracings. An analysis of the nature of cross talk is given in an article entitled "Predicting Crosstalk in Digital Systems" by John DeFalco in Computer Design, June 1973, pp. 69–75. A similar background discussion of the cross talk problem with a generalized mathematical analysis is provided in an article entitled "Crosstalk (Noise) in Digital Systems" by I. Cott in IEEE Transactions on Electronic Circuits, Vol. EC-16, No. 6, Dec. 1967. Cross talk results in the generation of spurious signals in a passive conductor which is closely adjacent an active conductor carrying a high frequency signal; the result is to contaminate the integrity of the signals present in the lines, thereby creating errors in transmitted signals and eventually affecting the overall operation of the circuit assembly. The higher the frequency of the pulses in the adjacent lines, the longer the line length, and the closer the lines are spaced, the greater the likelihood of cross talk contamination and its attendant problems. Coupled with high switching rates and close spacing, very rapid rise time signals, such as encountered in integrated circuit chips using emerging fabrication technologies, pose problems of energy coupling between adjacent conductive runs.

The main prior art approach to curing potential cross talk problems has been to keep distances which conductors extend parallel to each other below the length where cross talk is of concern or, if relatively long parallel runs are needed, to move the lines sufficiently apart to reduce the capacitive and inductive coupling between the lines to a tolerable level. In either approach, the problem of cross talk may be avoided.

However, there are circumstances when the conductor lines cannot be made sufficiently short or when space limitations make spreading the conductive runs either difficult or impossible. Such situations present themselves more frequently when logic elements or devices which are spread apart a considerable distance on a circuit board are required to be interconnected by a large number of lines.

OBJECTS AND SUMMARY OF THE INVENTION

A primary object of the present invention therefore is to provide an improved circuit assembly or package provided with a signal interconnecting scheme having a low cross talk profile.

A further object of the invention is the provision of an improved circuit board assembly for interconnecting a plurality of integrated circuit chips and other electronic devices on a circuit board wherein the assembly is capable of interconnecting the various electronic devices by means of closely spaced, parallel conductive runs capable of carrying high frequency electrical signals with reduced cross talk between such runs.

A yet further object of the invention is the provision of an improved circuit board assembly having conductor run configurations capable of supporting communication between various electronic devices on the circuit assembly by means of high rise time, high frequency, signals without undue generation of spurious signals or errors as a result of cross talk between interconnecting conductive runs.

Yet another object is the provision of a design rule or methodlogy for use in constructing interconnecting conductive runs on a circuit board assembly to limit cross talk and spurious signal generation when carrying high frequency, high rise time signals.

In accordance with the teachings of the present invention, these and other objects of the invention are accomplished by providing a circuit board assembly having supported thereon a plurality of electronic circuit devices. The devices are interconnected to carry signals therebetween by means of conductive runs which travel closely adjacent each other for a distance which, if it is greater than quarter of the wavelength of the clock or base frequency carried by the runs, is selected to be an integral multiple of half wavelengths of the basic clock frequency of the circuit or the base frequency carried by the conductors. Conductive runs much shorter than a quarter wavelength of the clock frequency are handled in the conventional manner and need no special attention due to cross talk problems.

BRIEF DESCRIPTION OF THE DRAWINGS

Further objects of the invention together with additional features contributing thereto and advantages derived therefrom will be apparent from the following description of the preferred embodiments of the invention which are illustrated by means of the accompanying drawings, wherein.

DESCRIPTION OF THE PREFERRED EMBODIMENT

As alluded to hereinbefore, the invention addresses the problem of cross talk, which becomes increasingly troublesome when interconnecting electronic devices or logic elements as digital system speeds increase. At high speeds, interconnection lines take on the attributes of transmission lines. Associated with these lines is the phenomenon of interconnection noise and currents known as cross talk. The most common example of the cross talk problem is the running of two or more wires in close proximity to each other and in substantially parallel relationship with each other for relatively long distances on a circuit board wherein one of the wire carries high frequency, rapid rise time signal. For the purposes of cross talk interference, two wires are considered to be in "close proximity" when the mutual capacitance and mutual inductance between the wires are sufficient to cause detectable spurious or erroneous signals on a passive wire when signals are present on an adjacent active wire at frequencies within the operating range of the circuit.

Figure 1:
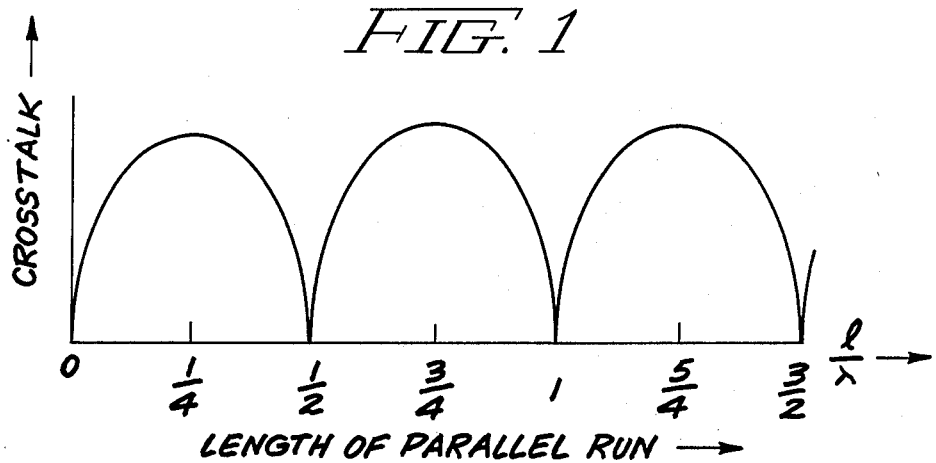
FIG. 1 is a graph which relates the relative magnitude of cross talk to the length of closely adjacent conductive traces, as expressed in wavelength units.

FIG. 1 is a graph which shows the magnitude of signal (cross talk) in a passive line which is closely adjacent to and running parallel with an active signal carrying line as a function of the distance the lines are parallel to each other, the distance being dimensioned in terms of fractions and multiples of the wavelength of the signal on the active line. The peak value of the cross talk signal would, of course, be also related to the distance between the active and passive lines. Thus, in situations where there is no ground plane and the lines are separated by a mil or so, the peak of the coupled signal, as shown in FIG. 1, would be a significant percentage of the amplitude in the active line, while if the lines were widely separated it would be only an insignificant fraction thereof (not illustrated). In situations where an adjacent ground plane exits, the coupling factor would be dependent on the distance between the lines relative to the ground plane; a large coupling would occur when the spacing between the lines was considerably smaller than the spacing to the ground plane. The cross talk phenomenon depicted in FIG. 1 is, as explained in the above noted article, a result of the adding and subtracting of both induced capacitive and inductive currents generated along the length of the passive line as a result of the signal in the active line.

As can be seen from FIG. 1, cross talk varies periodically as a function of the distance along which the conductors remain parallel to each other. Thus, if the distance along which the active and passive lines remain closely parallel to each other is equal to an integral number of quarter wavelengths of this base frequency, the cross talk (or amplitude of signal coupled from the active to the passive line) is at a maximum value. On the other hand, if the length of the closely adjacent parallel runs is equal to an integral number of half wavelengths of the base or clock frequency, the cross talk is at a minimum value. Of course, as the spacing between the parallel runs increases, field coupling decreases and the cross talk problem vanishes.

Given the above, it can be seen that the threshold distance at which cross talk becomes a significant problem arises as a function of the base or clock frequency of the operating circuit, as generally shown in Table I below.

TABLE I

| Base Frequency | Line Length for Max. Cross Talk* ($\frac{1}{4}\lambda$) | Line Length for Min. Cross Talk* ($\frac{1}{2}\lambda$) |
| --- | --- | --- |
| 50 MHz | 50 cm. | 100 cm. |
| 100 MHz | 25 cm. | 50 cm. |
| 200 MHz | 12.5 cm. | 25 cm. |
| 250 MHz | 10 cm. | 20 cm. |
| 300 MHz | 8.3 cm. | 16.6 cm. |
| 1000 MHz | 2.5 cm. | 5.0 cm. |

*Assume a typical or nominal phase velocity of $1 \times 10^8$ m/sec.

It can be seen from Table I that at a frequency of 50 MHz the distance at which maximum cross talk occurs ($\frac{1}{4}\lambda$) is approximately 50 cm., while distances below 10 cm. (assuming about 20% of max. cross talk is tolerable) normally allow insufficient coupling to become a concern. This situation (where frequencies of 50 MHz or less are used) poses no great circuit board layout problem since parallel conductive runs of 10 cm. or greater would not normally be needed to accomplish interconnections on a typical circuit board.

As opposed to this, at clock frequencies of 250-1000 MHz, maximum coupling between parallel closely spaced conductor runs occurs at about 10 cm. and 2.5 cm., respectively; appreciable cross talk may be present in this range of 5-10 cms. This is in a range which is forseeable to be required for interconnection during normal printed circuit board assembly of a plurality of integrated chips on a single board. Thus, as can be seen from the above, as the base frequency of a circuit increases to 250 MHz. and above, it may become necessary or desirable to interconnect various electronic devices on a circuit board using parallel runs of conductors which generate appreciable cross talk.

One alternative used in the prior art to avoid the cross talk problem even in situations where long parallel runs are needed is to space the wires sufficiently apart so that inductive and capacitive coupling therebetween is below the threshold where cross talk is significant. While this may be a simple solution to the problem, it may not always be possible to accomplish on a given circuit board. Even if such a solution is possible, it demands, as a price, the inefficient use of circuit board space. Since density of packaging is becoming a more critical factor in circuit board assembly, the latter choice may not always be attractive or acceptable.

Figure 2:
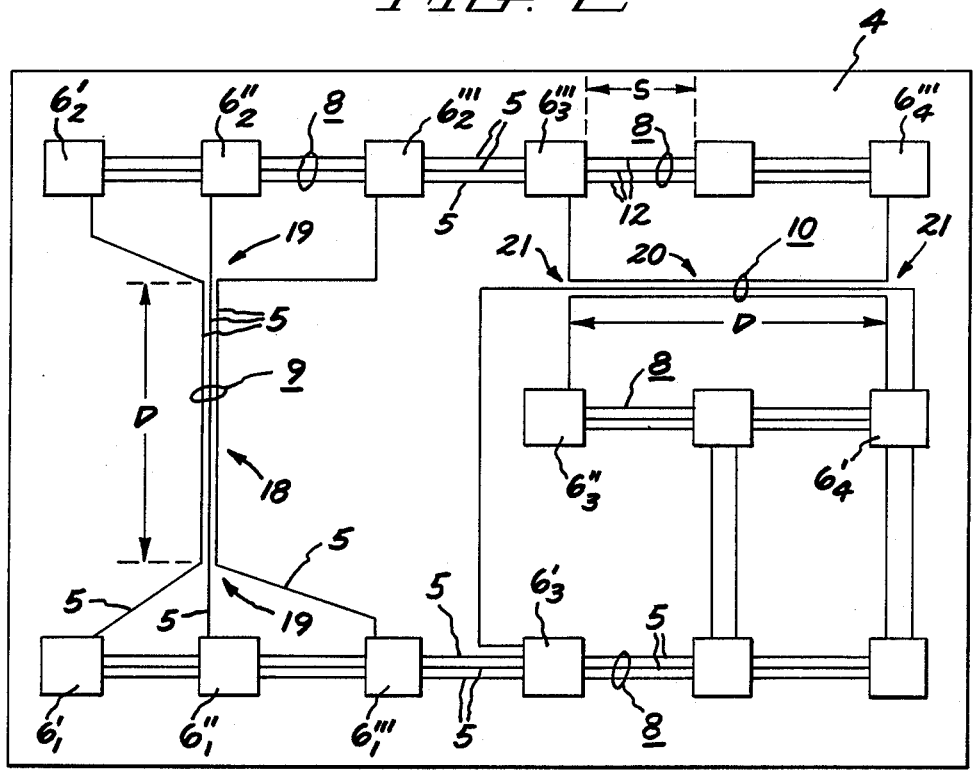
FIG. 2 is an illustrative view showing a circuit assembly according to the invention with the conductive runs electrically interconnecting integrated circuit chips in the assembly configured in a manner as provided in accordance with the teachings of the invention.

Given the above as background, reference is now made to FIG. 2 wherein is illustrated a conventional circuit board assembly including a circuit board 4 on which a plurality of electronic devices or integrated circuit chips 6 are supported. The circuit board 4 and chips 6 are conventional in nature and form no part of this invention. As can be appreciated by one skilled in the art, FIG. 2 omits many details of completed circuit board assemblies and shows only those portions which are relevant to understanding the instant invention.

The chips 6, in order to form an operational circuit assembly, are interconnected by several busses or groups 8, 9 and 10 of conductive traces or runs, each group consisting of a plurality of individual conductors or traces 5. These conductive runs may be fabricated in any conventional manner such as by deposition of a suitable conductive composition on the upper planar surface of the circuit board. The groups 8 of interconnections are seen to comprise a series of conductors which extend closely adjacent to each other and parallel to each other from first terminals on one of the chips, to second terminals on another of the chips located on the board. It will be assumed that the method of providing chip-to-conductor interconnection is conventional, such as leadless, leaded, etc. and no details of these interconnections are shown, since they form no part of this invention. It is assumed with respect to the groups 8 of interconnections that they couple chips 6 or other electronic devices which are relatively close to each other so that cross talk is not of concern. Specifically, the distances S between the chips interconnected by groups 8 of conductors is substantially less than a quarter wavelength of the base signal carried by these conductors forming the group 8. For the above reasons, cross talk is not sufficiently large in the conductors of group 8 to be of concern to the circuit designer.

On the other hand, other groups 9 and 10 of interconnecting conductors extend a relatively longer distance D than those of the groups 8. For purposes of this invention "relatively long", as used here, is understood to mean a distance at or above the threshold where cross talk is deemed to be problem that must be dealt with, i.e., at or near a multiple of quarter wavelengths of the base signal carried by the conductors.

In the case of the groups of interconnections 9 and 10 therefore, and in order to avoid deleterious effects of cross talk, it is proposed, according to the instant invention, to make the length D, as shown in FIG. 2 equal to an integral number of half wavelengths of the clock frequency or the base frequency of the circuit on the board or the signals carried by the conductors in question.

Thus, in order to accomplish a parallel conductor run of a preselected length with minimal cross talk, conductor run configurations similar to 9 and 10 shown in FIG. 2 may be used. As shown therein, conductor runs 9 and 10 are tailored to comprise first portions 18 and 20 in which the conductors extend closely adjacent each other and parallel to each other for a distance D equal to an integral multiple of half wavelengths, as provided above. Second sections 19 and 21 are provided at opposed ends of the parallel run sections 18 and 20 at which the individual conductors 5 or traces 5 sharply or abruptly diverge away from each other on paths for ultimate electrical connection to their associated electronic devices 6. By abruptly diverging away from each other mutual capacitance and inductance between the traces 5 of the groups 9 and 10 quickly decrease to a level below that which generates significant cross talk. To this end, sections 19 of the conductor run 9 are shown to include individual conductors 5 which extend to electrically interconnect integrated chips $6_1'$, $6_1''$ and $6_1'''$ with chips $6_2'$, $6_2''$, $6_2'''$, respectively. In a similar manner, sections 21 of the conductor run 10 are shown to include individual conductors which extend to electrically interconnect chips $6_3'$, $6_3''$ and $6_3'''$ with chips $6_4'$, $6_4''$ and $6_4'''$, respectively. Because the distance D is selected to be an integral number of half wavelengths of the base signal carried by one of the conductors in the group, cross talk is at a minimum, as seen from FIG. 1.

In the above manner, integrated chips which are a relatively great distance apart on the circuit board may be easily interconnected without causing appreciable cross talk between interconnecting conductors.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A circuit board assembly comprising:
   a circuit board;
   a plurality of electornic devices mounted on said board; and
   a plurality of conductor lines electrically interconnecting different ones of said devices, said lines forming a parallel section running closely adjacent and parallel to each other for a distance substantially equal to an integral number of half wavelengths of the clock frequency of the circuit supported by said board, said lines abruptly diverging from each other on opposite ends of said parallel section toward said plurality of devices for ultimate electrical connection therewith.

2. The assembly recited in claim 1 wherein said electronic devices are semiconductor integrated chips.

3. The assembly recited in claim 1 wherein said lines comprise conductive depositions supported on said board.

4. A bus for interconnecting a plurality of electronic devices on a circuit board comprising:
   a first section including a plurality of conductors running closely adjacent to and substantially parallel to each other for a distance substantially equal to an integral number of half wavelengths of the clock signal of the circuit on said board; and
   second sections on opposite ends of said first section at which said conductors abruptly diverge from each other, each on a path toward one of said devices.

5. The bus recited in claim 4 wherein said devices are semiconductor integrated electronic chips.

6. The bus of claim 4 wherein said conductors comprise conductive traces supported on said circuit board.

7. A method for electrically interconnecting electronic devices supported on a circuit board comprising the steps of:
   laying down conductive traces on said board interconnecting said devices, said traces forming an intermediate portion including a plurality of traces running closely adjacent and substantially parallel to each other, and end portions on opposite ends of said intermediate portion at which said traces diverge from each other on paths toward different ones of said devices, the length of said intermediate portion being substantially an integral number of half wavelengths of the base signal carried by one of said traces.

8. The method of claim 7 wherein said devices are semiconductor integrated chips.

* * * * *